US010156606B2

(12) United States Patent
Shen et al.

(10) Patent No.: US 10,156,606 B2
(45) Date of Patent: Dec. 18, 2018

(54) MULTI-CHASSIS TEST DEVICE AND TEST SIGNAL TRANSMISSION APPARATUS OF THE SAME

(71) Applicant: Test Research, Inc., Taipei (TW)

(72) Inventors: Yu-Chen Shen, Taipei (TW); Jia-Yan Gao, Taipei (TW)

(73) Assignee: Test Research, Inc., Taipei (TW)

( * ) Notice: Subject to any disclaimer, the term of this patent is extended or adjusted under 35 U.S.C. 154(b) by 221 days.

(21) Appl. No.: 14/988,698

(22) Filed: Jan. 5, 2016

(65) Prior Publication Data
US 2017/0192056 A1    Jul. 6, 2017

(51) Int. Cl.
*G01R 31/319* (2006.01)
*G01R 31/3177* (2006.01)
*G01R 31/317* (2006.01)

(52) U.S. Cl.
CPC ... *G01R 31/3177* (2013.01); *G01R 31/31701* (2013.01); *G01R 31/31723* (2013.01); *G01R 31/31727* (2013.01); *G01R 31/31907* (2013.01); *G01R 31/31926* (2013.01)

(58) Field of Classification Search
CPC .... G01R 31/318555; G01R 31/318572; G01R 31/318541; G01R 31/318536; G01R 31/3177; G01R 31/31926; G01R 31/31907; G01R 31/31701; G01R 31/31727; G01R 31/31723; H05K 999/99
USPC ......................................................... 714/727
See application file for complete search history.

(56) References Cited

U.S. PATENT DOCUMENTS

| | | | | |
|---|---|---|---|---|
| 5,216,637 A | * | 6/1993 | Vaillancourt | G06F 11/183 365/230.01 |
| 6,684,362 B1 | * | 1/2004 | Currier | G06F 13/4291 714/758 |
| 2002/0040456 A1 | * | 4/2002 | Mukherjee | G01R 31/31705 714/724 |
| 2002/0078412 A1 | * | 6/2002 | Wang | G01B 31/31851 714/732 |
| 2002/0165961 A1 | * | 11/2002 | Everdell | H04L 41/22 709/225 |
| 2003/0120822 A1 | * | 6/2003 | Langrind | H04L 29/1232 709/251 |

(Continued)

FOREIGN PATENT DOCUMENTS

| | | |
|---|---|---|
| JP | 2004233202 A | 8/2004 |
| TW | 201430361 A | 8/2014 |
| TW | 201430363 A | 8/2014 |

*Primary Examiner* — Albert Decady
*Assistant Examiner* — Enam Ahmed
(74) *Attorney, Agent, or Firm* — CKC & Partners Co., Ltd.

(57) ABSTRACT

A test signal transmission apparatus used in a multi-chassis test device is provided. The test signal transmission apparatus includes global buses and test signal transmission modules each including an I/O port coupled to a test controller, a test bus coupled to an in-circuit-tester system and a bridge matrix including an output unit and an input unit. The output unit either routes a first output signal from the I/O port to the test bus, or routes the first output signal to one of the global buses and routes a second output signal from another one of the global buses to the test bus. The input unit either routes a first input signal from the test bus to the I/O port, or routes the first input signal to one of the global buses and routes a second input signal from another one of the global buses to the I/O port.

18 Claims, 5 Drawing Sheets

(56) References Cited

U.S. PATENT DOCUMENTS

| | | | |
|---|---|---|---|
| 2007/0168766 A1* | 7/2007 | Le | G01R 31/31715 |
| | | | 714/700 |
| 2007/0245093 A1* | 10/2007 | Do | G11C 7/1012 |
| | | | 711/149 |
| 2009/0249126 A1 | 10/2009 | Cui et al. | |
| 2009/0279439 A1* | 11/2009 | Elliott | H04L 41/0659 |
| | | | 370/241 |
| 2009/0327573 A1* | 12/2009 | Jang | G11C 5/066 |
| | | | 711/5 |
| 2012/0271586 A1 | 10/2012 | Wang et al. | |
| 2013/0117766 A1* | 5/2013 | Bax | G06F 9/4405 |
| | | | 719/323 |
| 2015/0339252 A1* | 11/2015 | Anderson | H04L 9/38 |
| | | | 380/43 |

* cited by examiner

MULTI-CHASSIS TEST DEVICE AND TEST SIGNAL TRANSMISSION APPARATUS OF THE SAME

BACKGROUND

Field of Invention

The present invention relates to a test technology. More particularly, the present invention relates to a multi-chassis test device and a test signal transmission apparatus of the same.

Description of Related Art

Circuit board test fixtures are devices which are used in testing electronic circuits, often referred to as "devices under test" (DUTs). In use, the fixture generally holds and positions the DUT and establishes electrical interconnection between test equipment and test points or nodes on the DUT. The test equipment typically includes signal circuitry for generating selected excitation signals applied to the DUT test points through the fixture interconnections and for detecting or monitoring response signals therefrom as part of a manufacturer's quality assurance testing program or as a diagnostic procedure during circuit board repair and servicing.

Although known versions of such test fixtures are generally suitable for their intended purpose, certain inherent limitations have been identified. One such limitation stems from the fact that each different DUT will generally have test points arranged in a pattern unique to that DUT. if any modification is made to the printed circuit board components or circuitry that necessitates a change in the location of its test points, the test fixture must be redesigned and often rebuilt to account for the change in the test point pattern. Then the probes must again be wired to the test circuitry.

Accordingly, what is needed is a multi-chassis test device and a test signal transmission apparatus of the same to address the above issues.

SUMMARY

The invention provides a test signal transmission apparatus used in a test device. The test signal transmission apparatus includes a plurality of global buses and a plurality of test signal transmission modules. Each of the test signal transmission module includes an I/O port, a test bus and a bridge matrix. The I/O port is electrically coupled to a test controller. The test bus is electrically coupled to an in-circuit-tester system that is further electrically coupled to at least one device under test. The bridge matrix includes an output unit and an input unit. The output unit is configured to either route a first output signal received from the I/O port to the test bus, or to route the first output signal to one of the global buses and route a second output signal received from another one of the global buses to the test bus. The input unit is configured to either route a first input signal received from the test bus to the I/O port, or to route the first input signal to one of the global buses and route a second input signal received from another one of the global buses to the I/O port.

Yet another aspect of the present invention is to provide a multi-chassis test device. The multi-chassis test device includes at least one test controller, at least one in-circuit-tester system and a test signal transmission apparatus. The test controller is electrically coupled to a host and is configured to transmit a command from the host. The in-circuit-tester system is electrically coupled to a device under test and is configured to perform a test on the device under test based on the command of the host to generate a test result. The test signal transmission apparatus is electrically coupled between the test controller and the in-circuit-tester system and is configured to transmit the command from the test controller to the in-circuit-tester system and transmit the test result from the in-circuit-tester system to the test controller and further to the host. The test signal transmission apparatus includes a plurality of global buses and a plurality of test signal transmission modules. Each of the test signal transmission module includes an I/O port, a test bus and a bridge matrix. The I/O port is electrically coupled to the test controller. The test bus is electrically coupled to the in-circuit-tester system. The bridge matrix includes an output unit and an input unit. The output unit is configured to either route a first output signal received from the I/O port to the test bus, or to route the first output signal to one of the global buses and route a second output signal received from another one of the global buses to the test bus. The input unit is configured to either route a first input signal received from the test bus to the I/O port, or to route the first input signal to one of the global buses and route a second input signal received from another one of the global buses to the I/O port.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
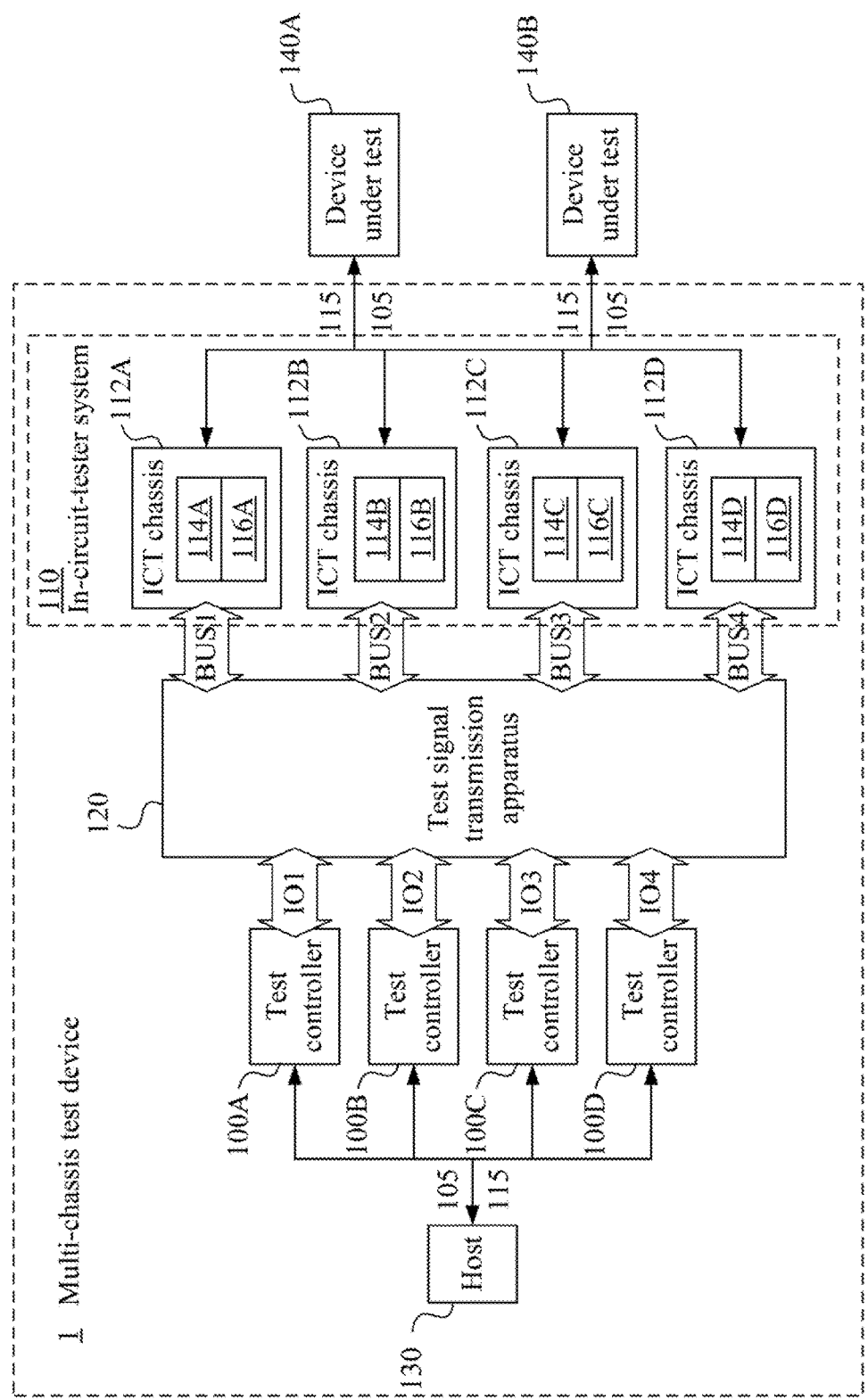
FIG. 1 is a block diagram of a test device in an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Reference is now made to FIG. 1. FIG. 1 is a block diagram of a multi-chassis test device 1 in an embodiment of the present invention. The multi-chassis test device 1 includes test controllers 100A-100D, an in-circuit-tester system 110 and a test signal transmission apparatus 120.

The test controllers 100A-100D are electrically coupled to a host 130. It is appreciated that the number of the test controllers illustrated in FIG. 1 is merely an example. In other embodiments, the number of the test controllers is not limited thereto.

In an embodiment, each of the test controllers 100A-100D is an IEEE1149.1 test access point controller such as, but not limited to a USB JTAG programmer or a COM port JTAG debugger. The test controllers 100A-100D are configured to transmit a command 105 from the host 130.

The in-circuit-tester system 110 is electrically coupled to devices under test 140A-140B. In an embodiment, the devices under test 140A-140B can be two integrated circuits disposed in a single package or can be two independent packages. It is appreciated that the number of the devices under test illustrated in FIG. 1 is merely an example. In other embodiments, the number of the devices under test is not limited thereto.

In an embodiment, the in-circuit-tester system 110 includes a plurality of in-circuit-test chassis 112A-112D. Each of the in-circuit-test chassis 112A-112D includes test modules 114A-114D and 116A-116D. The test modules 114A-1140 and 116A-116D are configured to perform a test on the devices under test 140A-140B based on the command 105 of the host 130 to generate a test result 115. It is appreciated that the number of the in-circuit-test chassis and the test modules included therein illustrated in FIG. 1 is merely an example. In other embodiments, the number of the in-circuit-test chassis and the test modules included therein under test is not limited thereto.

The test signal transmission apparatus 120 is electrically coupled between the test controllers 100A-100D and the in-circuit-tester system 110. The test signal transmission apparatus 120 is configured to transmit the command 105 from the test controller 100A-100D to the in-circuit-tester system 110 and transmit the test result 115 from the in-circuit-tester system 110 to the test controller 100A-100D and further to the host 130.

Figure 2A:
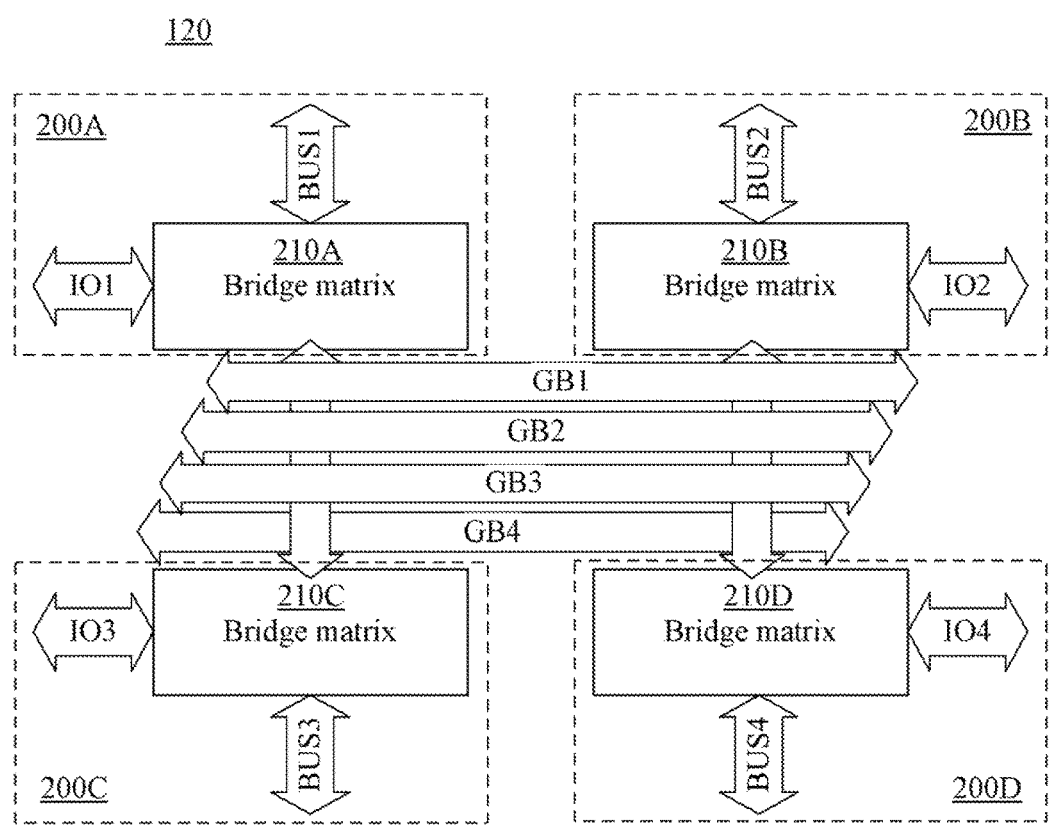
FIG. 2A is a block diagram of the test signal transmission apparatus in an embodiment of the present invention.

Reference is now made to FIG. 2A. FIG. 2A is a block diagram of the test signal transmission apparatus 120 in an embodiment of the present invention. The test signal transmission apparatus 120 includes global buses GB1-GB4 and test signal transmission modules 200A-200D.

It is appreciated that the number of the global buses, the test signal transmission modules and the corresponding I/O ports and test buses illustrated in FIG. 2 is merely an example. In other embodiments, the number of the global buses, the test signal transmission modules and the corresponding I/O ports and test buses is not limited thereto.

Each of the test signal transmission modules 200A-200D includes an I/O port, a test bus and a bridge matrix. More specifically, the test signal transmission module 200A include an I/O port IO1, a test bus BUS1 and a bridge matrix 210A. The test signal transmission module 200B include an I/O port IO2, a test bus BUS2 and a bridge matrix 210B. The test signal transmission module 200C include an I/O port IO3, a test bus BUS3 and a bridge matrix 210C. The test signal transmission module 200D include an I/O port IO4, a test bus BUS4 and a bridge matrix 210D.

In an embodiment, the test signal transmission modules 200A-200D have identical configuration. Take the test signal transmission module 200A as an example, the I/O port IO1 of the test signal transmission module 200A is electrically coupled to the one of the test controllers illustrated in FIG. 1, such as the test controller 100A. The test bus BUS1 is electrically coupled to one of the in-circuit-test chassis 112A-112D of the in-circuit-tester system 110 illustrated in FIG. 1, such as the in-circuit-test chassis 112A. Under such a condition, the test bus BUS1 is electrically coupled to a backplane (not illustrated) of the in-circuit-test chassis 112A.

Both the I/O ports IO1-IO4 and the test buses BUS1-BUS4 are bi-directional. In an embodiment, the I/O ports IO1-IO4 and the test buses BUS1-BUS4 are configured to transmit output signals, such as a clock signal (TCK), a data signal (TDI) and a mode select signal (TMS) included in the command 105 from the test controllers 100A-100D through the bridge matrix 210A-210D to the in-circuit-tester system 110.

Further, the I/O ports IO1-IO4 and the test buses BUS1-BUS4 are configured to transmit input signals, such as a data signal (TDO) included in the test result 115 from the in-circuit-tester system 110 through the bridge matrix 210A-210D to the test controllers 100A-100D.

Figure 2B:
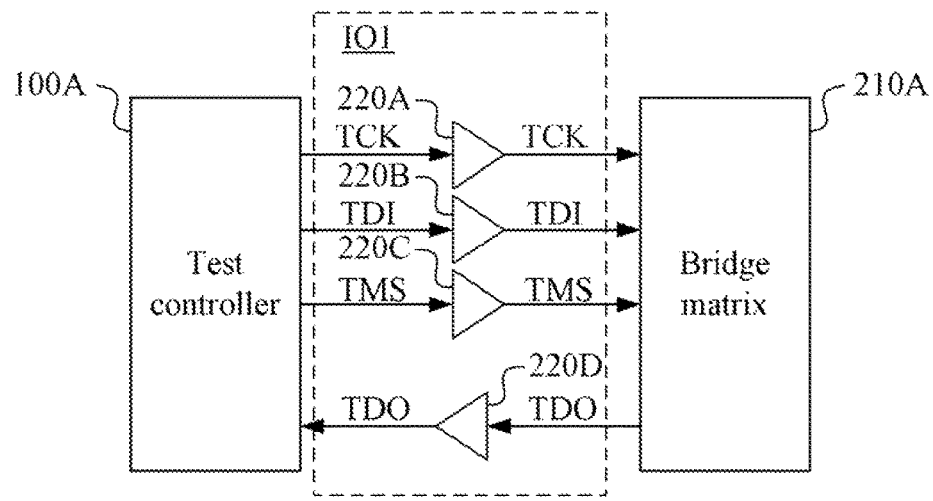
FIG. 2B is detail diagram of the test controller, the I/O port and the bridge matrix in an embodiment of the present invention.

Reference is now made to FIG. 2B. FIG. 2B is an exemplary diagram of the test controller 100A, the I/O port IO1 and the bridge matrix 210A in an embodiment of the present invention.

As illustrated in FIG. 2B, the I/O port IO1 includes buffers 220A, 220B and 220C for transmitting the clock signal TCK, the data signal TDI and the mode select signal TMS respectively from the test controller 100A to the bridge matrix 210A. The I/O port IO1 further includes a buffer 220D for transmitting the data signal TDO from the bridge matrix 210A to the test controller 100A.

Figure 2C:
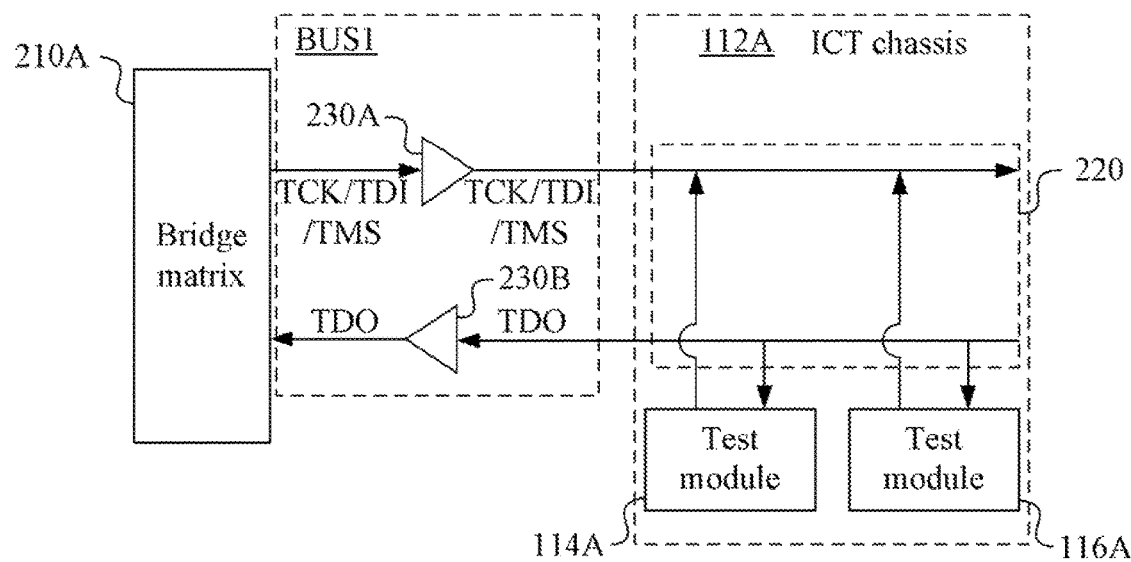
FIG. 2C is an exemplary diagram of the bridge matrix, the test bus and the in-circuit-tester system in an embodiment of the present invention.

Reference is now made to FIG. 2C. FIG. 2C is an exemplary diagram of the bridge matrix 210A, the test bus BUS1 and the in-circuit-test chassis 112A in an embodiment of the present invention.

As illustrated in FIG. 2C, the test bus BUS1 includes a buffer 230A for transmitting the clock signal TCK, the data signal TDI and the mode select signal TMS from the bridge matrix 210A to the in-circuit-test chassis 112A. The clock signal TCK, the data signal TDI and the mode select signal TMS are then transmitted to the test modules 114A and 116A through backplane buses 220. The test bus BUS1 further includes a buffer 230B for transmitting the data signal TDO from the test modules 114A and 116A of the in-circuit-test chassis 112A through the backplane buses 220 to the bridge matrix 210A.

Figure 3:
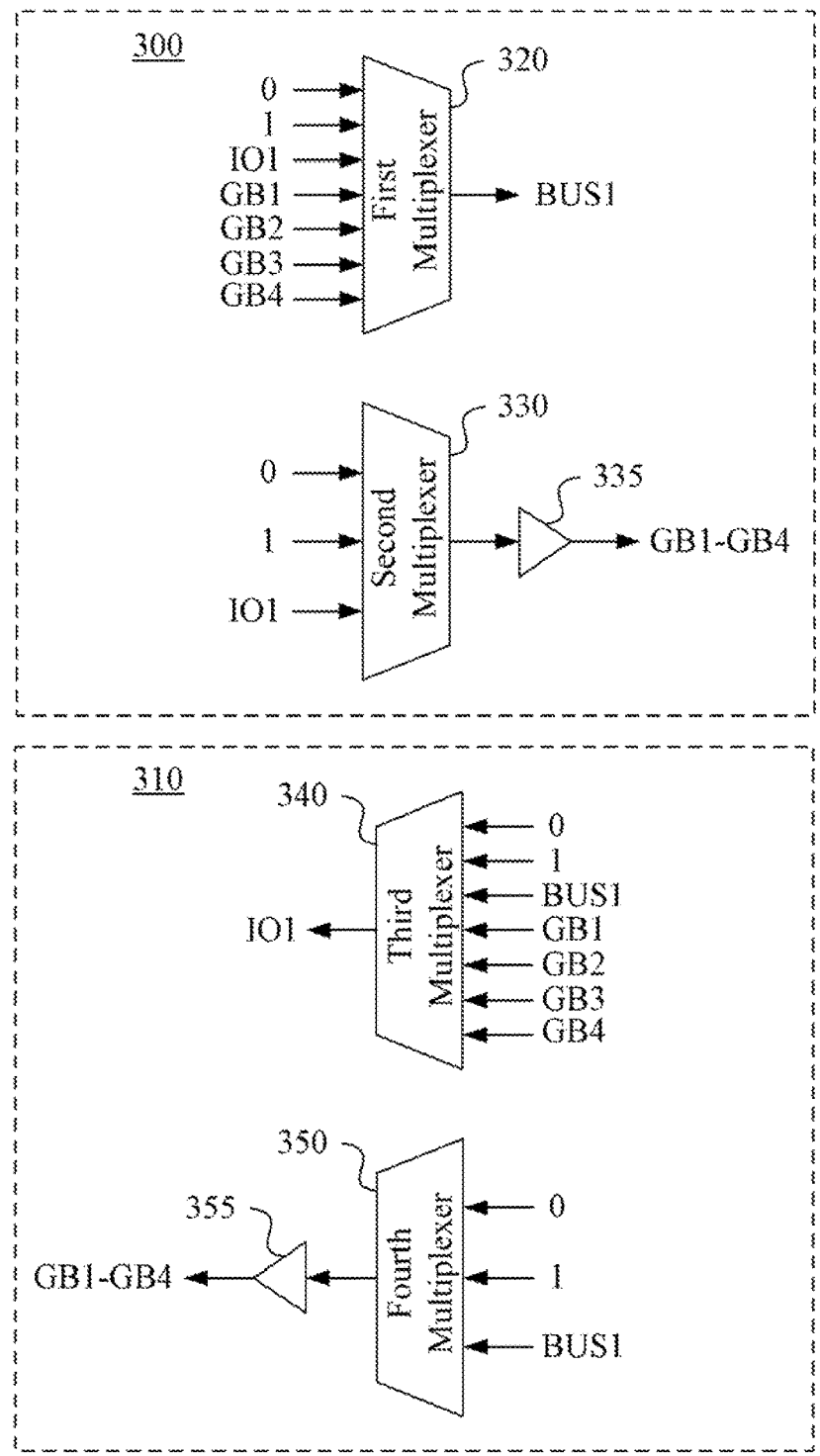
FIG. 3 is a block diagram of the bridge matrix in an embodiment of the present invention.

Reference is now made to FIG. 3 at the same time. FIG. 3 is a block diagram of the bridge matrix 210A in an embodiment of the present invention. The bridge matrix 210A includes an output unit 300 and an input unit 310.

In operation, the output unit 300 is configured to either route a first output signal (not illustrated) received from the I/O port IO1 to the test bus BUS1, or to route the first output signal (not illustrated) to one of the global buses GB1-GB4 and route a second output signal (not illustrated) received from one of the other one of the global buses GB1-GB4 to the test bus BUS1.

In an embodiment, each of the first output signal and the second output signal mentioned above is the clock signal TCK, the data signal TDI and the mode select signal TMS included in the command 105.

The detail configuration and the operation of the output unit 300 are further described in the following paragraphs.

In an embodiment, the output unit 300 includes a first multiplexer 320 and a second multiplexer 330.

The first multiplexer 320 has a first multiplexer input interface electrically coupled to the I/O port IO1 and the global buses GB1-GB4. The first multiplexer 320 further has a first multiplexer output interface electrically coupled to the test bus BUS1. It is appreciated that in some applications, the first multiplexer input interface is further electrically coupled to a high state voltage source labeled as "1" in FIG. 3 and a low state voltage source labeled as "0" in FIG. 3 to transmit a high state voltage or a low state voltage.

The second multiplexer 330 having a second multiplexer input interface electrically coupled to the I/O port IO1 and a second multiplexer output interface electrically coupled to one of the global buses GB1-GB4.

In a first operation mode, the first multiplexer 320 selects a first output signal received from the I/O port IO1 through the first multiplexer input interface and directly transmits the first output signal to the test bus BUS1 through the first multiplexer output interface. Under such a condition, the second multiplexer 330 can be floating without outputting any signal.

In a second operation mode, the second multiplexer 330 routes the first output signal received from the I/O port IO1 to one of the global buses GB1-GB4, the first multiplexer 320 routes the second output signal received from another one of the global buses GB1-GB4 to the test bus BUS1. For example, the first multiplexer 320 may route the first output signal received from the I/O port IO1 to the global bus GB3 and route the second output signal received from the global bus GB2 to the test bus BUS1.

Under such a condition, when the global bus GB3 is electrically coupled to such as, but not limited to the bridge matrix 210D, the bridge matrix 210D can route the first output signal to the test bus BUS4 through the second multiplexer 330 of the bridge matrix 210D.

In an embodiment, an output buffer 335 can be disposed between the second multiplexer 330 and the global buses GB1-GB4 such that when the first output signal is routed to one of the global buses GB1-GB4, the first output signal can be amplified.

As a result, by using the output unit 300, the first output signal received from the I/O port IO1 can be either directly transmitted to the test bus BUS1, or can be routed to one of the global buses GB1-GB4 and further to one of the test buses BUS2-BUS4. The output signal can be transmitted to any one of the desired test buses BUS1-BUS4. By employing such a technique to the bridge matrix 210A-210D, the transmission of the output signals can be performed between any I/O port and any test bus.

It is appreciated that the user can manually modify the setting of the first multiplexer 320 and the second multiplexer 330 of the bridge matrix 210A-210D to determine the operation mode to perform the desired signal transmission according to the practical demands. Further, it is appreciated that the global buses GB1-GB4 are not necessary corresponding to the bridge matrix 210A-210D respectively. The user can also manually determine the connection between the bridge matrix 210A-210D and the global buses GB1-GB4.

On the other hand, the input unit 310 is configured to either route a first input signal received from the test bus BUS1 to the I/O port IO1, or to route the first input signal to one of the global buses GB1-GB4 and route a second input signal received from another one of the global buses GB1-GB4 to the I/O port IO1.

In an embodiment, each the first input signal and the second input signal mentioned above is the data signal TDO included in the test result 115.

The detail configuration and the operation of the input unit 310 are further described in the following paragraphs.

In an embodiment, the input unit 310 includes a third multiplexer 340 and a fourth multiplexer 350.

The third multiplexer 340 has a third multiplexer input interface electrically coupled to the test bus BUS1 and the global buses GB1-GB4. The third multiplexer 340 further has a third multiplexer output interface electrically coupled to the I/O port IO1. It is appreciated that in some applications, the third multiplexer input interface is further electrically coupled to a high state voltage source labeled as "1" in FIG. 3 and a low state voltage source labeled as "0" in FIG. 3 to transmit a high state voltage or a low state voltage.

The fourth multiplexer 350 having a fourth multiplexer input interface electrically coupled to the test bus BUS1 and a fourth multiplexer output interface electrically coupled to one of the global buses GB1-GB4.

In a first operation mode, the third multiplexer 340 selects a first input signal received from the test bus BUS1 through the third multiplexer input interface and directly transmits the first input signal to the I/O port IO1 through the third multiplexer output interface. Under such a condition, the fourth multiplexer 350 can be floating without outputting any signal.

In a second operation mode, the fourth multiplexer 350 routes the first input signal received from the test bus BUS1 to one of the global buses GB1-GB4, the third multiplexer 340 routes the second input signal received from another one of the global buses GB1-GB4 to the I/O port IO1. For example, the third multiplexer 340 may route the first input signal received from the test bus BUS1 to the global bus GB3 and route the second input signal received from the global bus GB2 to the I/O port IO1.

Under such a condition, when the global bus GB3 is electrically coupled to such as, but not limited to the bridge matrix 210D, the bridge matrix 210D can route the first input signal to the I/O port IO4 through the fourth multiplexer 350 of the bridge matrix 210D.

In an embodiment, an output buffer 355 can be disposed between the second multiplexer 330 and the global buses GB1-GB4 such that when the first input signal is routed to one of the global buses GB1-GB4, the first input signal can be amplified.

As a result, by using the input unit 310, the first input signal received from the test bus BUS1 can be either directly transmitted to the I/O port IO1, or can be routed to one of the global buses GB1-GB4 and further to one of the I/O ports IO2-IO4. Thee input signal can be transmitted to any one of the desired I/O ports IO1-IO4. By employing such a technique to the bridge matrix 210A-210D, the transmission of the input signals can be performed between any test bus and any I/O port.

It is appreciated that the user can manually modify the setting of the third multiplexer 340 and the fourth multiplexer 350 of the bridge matrix 210A-210D to determine the operation mode to perform the desired signal transmission according to the practical demands. Further, it is appreciated that the global buses GB1-GB4 are not necessary corresponding to the bridge matrix 210A-210D respectively. The user can also manually determine the connection between the bridge matrix 210A-210D and the global buses GB1-GB4.

In conclusion, the multi-chassis test device 1 of the present invention can perform signal transmission between any one of the test controllers 100A-100D and the in-circuit-tester system 110 by using the test signal transmission apparatus 120. The test procedure for the device under test can be performed with greater elasticity without modifying any transmission architecture.

Figure 4:
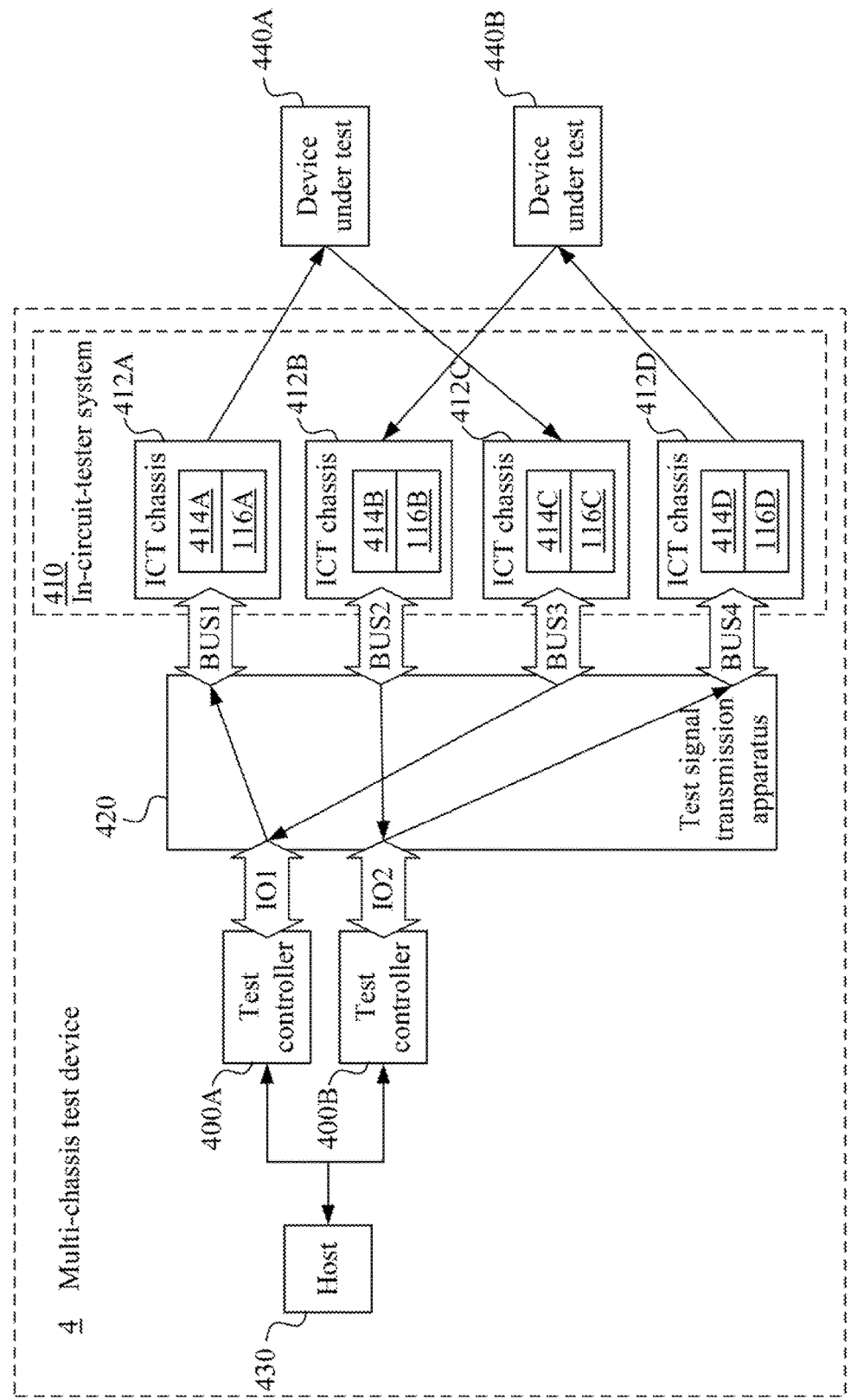
FIG. 4 is a block diagram of a test device in an embodiment of the present invention.

Reference is now made to FIG. 4. FIG. 4 is a block diagram of a multi-chassis test device 4 in an embodiment of the present invention. The multi-chassis test device 4 includes test controllers 400A-400B, an in-circuit-tester system 410 and a test signal transmission apparatus 420.

In a practical application, the test controllers 400A-400B are a universal serial bus (USB) joint test action group (JTAG) programmer and a COM port JTAG debugger electrically coupled to a host 430. The in-circuit-tester system 410 includes a plurality of in-circuit-test chassis 412A-412D. Each of the in-circuit-test chassis 412A-412D includes test modules 414A-414D and 416A-416D. The test modules 414A-414D and 416A-416D are configured to perform test on two devices under test 440A and 440B. By employing the test signal transmission apparatus 420 identical to the test signal transmission apparatus 120 described above, the command transmitted to the test controller 400A may be exemplarily routed to the in-circuit-test chassis 412A and further to the device under test 440A. The command transmitted to the test controller 400B may be exemplarily routed to the in-circuit-test chassis 412D and further to the device under test 440B. The test result transmitted from the device under test 440A may be transmitted to the in-circuit-test chassis 412C, be routed to the test controller 400A and further to the host 430. The test result transmitted from the device under test 440B may be transmitted to the in-circuit-test chassis 412B, be routed to the test controller 400B and further to the host 430.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A test signal transmission apparatus used in a multi-chassis test device, wherein the test signal transmission apparatus comprises:
   a plurality of global buses; and
   a plurality of test signal transmission modules each comprising:
      an I/O port electrically coupled to a test controller, and the test controller configured to transmit a command;
      a test bus electrically coupled to an in-circuit-tester system that is further electrically coupled to at least one device under test; and
      a bridge matrix comprising:
         an output unit configured to either route a first output signal received from the I/O port to the test bus, or to route the first output signal to one of the global buses and route a second output signal received from another one of the global buses to the test bus, wherein each of the first output signal and the second output signal is included in the command; and
         an input unit configured to either route a first input signal received from the test bus to the I/O port, or to route the first input signal to one of the global buses and route a second input signal received from another one of the global buses to the I/O port, wherein each of the first input signal and the second input signal is included in a test result transmitted from the in-circuit-tester system.

2. The test signal transmission apparatus of claim 1, wherein the test controller is an IEEE1149.1 test access point controller.

3. The test signal transmission apparatus of claim 1, wherein each of the first output signal and the second output signal is a clock signal, a data signal or a mode select signal.

4. The test signal transmission apparatus of claim 1, wherein each the first input signal and the second input signal is a data signal.

5. The test signal transmission apparatus of claim 1, wherein the in-circuit-tester (ICT) system comprises a plurality of ICT chassis each comprising at least one test module electrically coupled to the device under test, wherein the test bus is electrically coupled to a backplane of the in-circuit-tester system.

6. The test signal transmission apparatus of claim 1, wherein the output unit comprises:
   a first multiplexer having a first multiplexer input interface electrically coupled to one of the I/O port and the global buses and a first multiplexer output interface electrically coupled to the test bus; and
   a second multiplexer having a second multiplexer input interface electrically coupled to the I/O port and a second multiplexer output interface electrically coupled to one of the global buses.

7. The test signal transmission apparatus of claim 6, wherein when the second multiplexer routes the first output signal received from the I/O port to one of the global buses, the first multiplexer routes a second output signal received from another one of the global buses to the test bus.

8. The test signal transmission apparatus claim 1, wherein the input unit comprises:
   a third multiplexer having a third multiplexer input interface electrically coupled to the test bus and the global buses and a third multiplexer output interface electrically coupled to the I/O port; and
   a fourth multiplexer having a fourth multiplexer input interface electrically coupled to the test bus and a fourth multiplexer output interface electrically coupled to one of the global buses.

9. The test signal transmission apparatus of claim 8, wherein when the fourth multiplexer routes the first input signal received from the test bus to one of the global buses, the third multiplexer routes second input signal received from another one of the global buses to the I/O port.

10. A multi-chassis test device comprising:
   at least one test controller electrically coupled to a host and configured to transmit a command from the host;
   at least one in-circuit-tester system electrically coupled to at least one device under test and configured to perform a test on the device under test based on the command of the host to generate a test result; and
   a test signal transmission apparatus electrically coupled between the test controller and the in-circuit-tester system and configured to transmit the command from the test controller to the in-circuit-tester system and transmit the test result from the in-circuit-tester system to the test controller and further to the host, wherein the test signal transmission apparatus comprises:
      a plurality of global buses; and
      a plurality of test signal transmission modules each comprising:
         an I/O port electrically coupled to the test controller;
         a test bus electrically coupled to the in-circuit-tester system; and
         a bridge matrix comprising:
            an output unit configured to either route a first output signal received from the I/O port to the test bus, or to route the first output signal to one of the global buses and route a second output signal received from another one of the global buses to the test bus, wherein each of the first output signal and the second output signal is included in the command; and an input unit configured to either route a first input signal received from the test bus to the I/O port, or to route the first input signal to one of the global buses and route a second input signal received from another one of the global buses to the I/O port, wherein each of the first input signal and the second input signal is included in a test result transmitted from the in-circuit-tester system.

11. The multi-chassis test device of claim 10, wherein the test controller is an IEEE1149.1 test access point controller.

12. The multi-chassis test device of claim 10, wherein each of the first output signal and the second output signal is a dock signal, a data signal or a mode select signal comprised in the command.

13. The multi-chassis test device of claim 10, wherein each the first input signal and the second input signal is a data signal comprised in the test result.

14. The multi-chassis test device of claim 10, wherein the in-circuit-tester (ICT) system comprises a plurality of ICT chassis each comprising at least one test module electrically coupled to the device under test, wherein the test bus is electrically coupled to a backplane of the in-circuit-tester system.

15. The multi-chassis test device of claim 10, wherein the output unit comprises:

a first multiplexer having a first multiplexer input interface electrically coupled to one of the I/O port and the global buses and a first multiplexer output interface electrically coupled to the test bus; and a second multiplexer having a second multiplexer input interface electrically coupled to the I/O port and a second multiplexer output interface electrically coupled to one of the global buses.

16. The multi-chassis test device of claim 15, wherein when the second multiplexer routes the first output signal received from the I/O port to one of the global buses, the first multiplexer routes a second output signal received from another one of the global buses to the test bus.

17. The multi-chassis test device claim 10, wherein the input unit comprises:

a third multiplexer having a third multiplexer input interface electrically coupled to the test bus and the global buses and a third multiplexer output interface electrically coupled to the I/O port; and a fourth multiplexer having a fourth multiplexer input interface electrically coupled to the test bus and a fourth multiplexer output interface electrically coupled to one of the global buses.

18. The multi-chassis test device of claim 17, wherein when the fourth multiplexer routes the first input signal received from the test bus to one of the global buses, the third multiplexer routes second input signal received from another one of the global buses to the I/O port.

* * * * *